United States Patent
Shukla et al.

(10) Patent No.: US 10,947,152 B2
(45) Date of Patent: Mar. 16, 2021

(54) ELECTROSTATIC DOPING OF A LAYER OF A CONDUCTIVE OR NON-CONDUCTIVE MATERIAL

(71) Applicants: CENTRE NATIONAL DE LA RECHERCHE SCIENTIFIQUE, Paris (FR); UNIVERSITE PIERRE ET MARIE CURIE (PARIS 6), Paris (FR)

(72) Inventors: Abhay Shukla, L'Hay les Roses (FR); Johan Biscaras, Paris (FR); Andrea Paradisi, Montrouge (FR)

(73) Assignees: CENTRE NATIONAL DE LA RECHERCHE SCIENTIFIC, Paris (FR); UNIVERSITE PIERRE ET MARIE CURIE (PARIS 6), Paris (FR)

( * ) Notice: Subject to any disclaimer, the term of this patent is extended or adjusted under 35 U.S.C. 154(b) by 227 days.

(21) Appl. No.: 15/747,564

(22) PCT Filed: Jul. 27, 2016

(86) PCT No.: PCT/FR2016/051942
§ 371 (c)(1),
(2) Date: Jan. 25, 2018

(87) PCT Pub. No.: WO2017/017372
PCT Pub. Date: Feb. 2, 2017

(65) Prior Publication Data
US 2018/0215658 A1    Aug. 2, 2018

(30) Foreign Application Priority Data
Jul. 30, 2015    (FR) ........................ 1557308

(51) Int. Cl.
*C03C 17/245* (2006.01)
*C03C 17/22* (2006.01)
(Continued)

(52) U.S. Cl.
CPC ............ *C03C 17/245* (2013.01); *C03C 17/22* (2013.01); *C03C 17/23* (2013.01); *H01L 31/028* (2013.01);
(Continued)

(58) Field of Classification Search
CPC .............................. C03C 21/008; C03C 17/22
See application file for complete search history.

(56) References Cited

U.S. PATENT DOCUMENTS 7,176,528 B2    2/2007    Couillard et al.
2009/0032873 A1    2/2009    Cites et al.
(Continued)

FOREIGN PATENT DOCUMENTS

KR    20010036360 A    *    5/2001
KR    2014 0105230        9/2014
(Continued)

OTHER PUBLICATIONS

Translation of KR20010036360, no date.*
(Continued)

*Primary Examiner* — Alex A Rolland
(74) *Attorney, Agent, or Firm* — IPSILON USA, LLP

(57) ABSTRACT

The invention relates to a process for permanently electrostatically doping a layer of a conductive or non-conductive material that is deposited on a solid substrate, to the doped material obtained according to this process, and to the use of such a material.

7 Claims, 3 Drawing Sheets

(51) Int. Cl.
  *C03C 17/23* (2006.01)
  *H01L 31/18* (2006.01)
  *H01L 31/028* (2006.01)
  *H01L 31/032* (2006.01)
  *H01L 31/0224* (2006.01)
  *H01B 13/00* (2006.01)
  *H01L 39/24* (2006.01)

(52) U.S. Cl.
  CPC .... *H01L 31/022466* (2013.01); *H01L 31/032* (2013.01); *H01L 31/0321* (2013.01); *H01L 31/18* (2013.01); *H01L 31/1884* (2013.01); *C03C 2217/216* (2013.01); *C03C 2217/28* (2013.01); *C03C 2217/288* (2013.01); *C03C 2217/944* (2013.01); *C03C 2218/152* (2013.01); *C03C 2218/154* (2013.01); *C03C 2218/32* (2013.01); *H01B 13/0033* (2013.01); *H01L 39/24* (2013.01); *Y02E 10/547* (2013.01)

(56) References Cited

U.S. PATENT DOCUMENTS

| 2013/0000833 A1 | 1/2013 | Shukla et al. |
| 2015/0246847 A1* | 9/2015 | Abdolvand ........... C03C 21/008 428/410 |

FOREIGN PATENT DOCUMENTS

| WO | WO-2013107996 A1 * | 7/2013 | ........... C03C 21/008 |
| WO | 2015143371 | 9/2015 | |

OTHER PUBLICATIONS

Karim Gacem et al: 11 Paper;High quality 2D crystals made by anodic bonding: a general technique for layered materials;High quality 2D crystals made by anodic bonding: a general technique for layered materials 11, Nanotechnology, IOP, Bristol, GB, vol. 23, No. 50, Nov. 29, 2012.

International Search Report dated May 25, 2016.

* cited by examiner

ELECTROSTATIC DOPING OF A LAYER OF A CONDUCTIVE OR NON-CONDUCTIVE MATERIAL

RELATED APPLICATION

This application is a National Phase of PCT/FR2016/051942, filed on Jul. 27, 2016, which in turn claims the benefit of priority from French Patent application No. 15 57308, filed on Jul. 30, 2015 the entirety of which are incorporated by reference.

FIELD OF THE INVENTION

The invention relates to a process for permanently electrostatically doping a layer of a conductive or non-conductive material that is deposited on a solid substrate, to the doped material obtained according to this process, and to the use of such a material.

DESCRIPTION OF THE RELATED ART

The conductive transparent layers are used in numerous devices such as touchscreens, electrochromic glass or photovoltaic cells. These conductive layers are made of conductive or non-conductive materials and are generally doped in order to modify their electronic properties and increase their conductivity.

Doping modifies the conductivity of the conductive or non-conductive material by modifying the charge carrier density in the material. The charge carriers of a material are both electrons and holes, i.e. electron-deficient regions.

The most common method for modifying the charge carrier density of a conductive or non-conductive material is chemical doping, which consists in introducing impurities, i.e. atoms of the dopant substance, into the material. In the case of the impurities being electron rich, doping leads to an excess of electrons, which are negatively charged, and this is referred to as n-type doping. In the case of the impurities being electron poor, doping leads to an electron deficiency, i.e. an excess of holes, which are considered to be positively charged, and this is referred to as p-type doping. However, the chemical doping of the material has two major drawbacks. First, this technique is not reversible and it is therefore necessary to produce a new sample if it is desired to modify the nature or the intensity of the doping. Second, modifying the chemical composition may lead to the doped material becoming disorganized. Furthermore, the chemical doping of certain materials such as graphene is not entirely satisfactory since it is not stable with time (FIG. 2, Kim et al., Nanotechnology, 2010, 21, 285205).

Another method for modifying charge carrier density is electrostatic doping. This method consists in applying an electric field to a surface by creating a potential difference between an electrode and the surface, which are separated by an insulator. This is the principle of a field-effect transistor, which has successfully been used to dope ultra-thin materials (Ahn et al. *Rev. Mod. Phys.*, 2006, 78, p 1185-1212). However, doping is limited to low values using this method since the insulator, the interface between the electrode and the surface to be doped, tends to break down once its dielectric strength has been overcome when the electric field is increased for the purpose of increasing the level of doping (formation of an electric arc in the material: breakdown).

To get around this limitation, electrostatic doping has also been developed using processes carried out in ionic liquids (see for example Misra, R. et al., App. Phys. Lett., 2007, 90, 052905). In this case, the electric field is formed between a layer of ions in the electrolyte and the surface of the electrode immersed in the electrolyte, which is also the surface to be doped. Although such processes allow very high levels of doping to be reached, they are complex to implement and cannot be applied to any type of conductive or non-conductive material, since they still require an electrochemical cell-type device. Similarly, implementing these processes may produce electrochemical reactions that might transform the electrostatic characteristic of the device. Moreover, these processes do not allow the material to be doped in a perfectly controlled and reversible manner.

There is therefore no process in the prior art that allows a layer of a conductive or non-conductive material deposited on a substrate to be doped in a controlled and reversible manner with very high levels of doping.

However, methods for bonding a conductive or non-conductive material to a glassy matrix under the effect of an electric field are described in the prior art. These methods make use of the particular properties of glassy matrices (or glasses). Glasses consist of "network-forming" oxides that form, by themselves, the skeleton of the glassy matrix and "network-modifying" (or "non-network-forming") oxides that are not able to form a glassy matrix by themselves. The network-forming oxides include silicon oxide ($SiO_2$), which is the predominant constituent of glassy matrices, as well as other oxides such as boron oxide ($B_2O_3$), phosphorus oxide ($P_2O_5$) and germanium oxide ($GeO_2$). The network-modifying oxides are essentially alkali metal oxides, alkaline-earth metal oxides and, to a lesser extent, certain oxides of transition or rare-earth elements. The alkali metal oxides, also referred to as "fluxes", are used to lower the melting point of the glassy matrix. They comprise in particular sodium oxide ($Na_2O$), potassium oxide ($K_2O$), and lithium oxide ($Li_2O$). Other oxides, also referred to as "stabilizers", are used to modify the physical and/or mechanical properties of the glassy matrix that are generally attenuated by the addition of the fluxes. They comprise alkaline-earth metal oxides such as calcium oxide (CaO), which increases the chemical resistance of the glass, zinc oxide (ZnO), which increases the brilliance and elasticity of the glass, iron oxide ($Fe_2O_3$), which is both a stabilizer and a pigment, and lead oxide (PbO), which forms part of the composition of the crystal and also lowers the melting point by stabilizing the vitreous composition.

Glass is an insulator at a temperature referred to as the operating temperature and may become conductive at a higher temperature. Specifically, while the constituent atoms of the network-forming oxides are bonded to one another to form the skeleton of the glassy matrix, the network-modifying oxides are themselves distributed throughout the glassy matrix without being linked to the network-forming oxides. Thus, as the temperature of the glassy matrix rises, the ions of the network-modifying oxides that are present in the glassy matrix tend to become mobile, the glassy matrix then becoming an ionic conductor.

Thus, Wallis et al. describe bonding a layer of a material such as silicon to a glassy matrix in a process consisting in exposing the glassy matrix/material assembly to a temperature ranging from 300° C. to 600° C. then applying an electric field ranging from 200 V to 2000 V, resulting in an anodic bond being formed between the silicon layer and the glassy matrix by electrostatic interactions (Wallis, G., et al., I. J. Appl. Phys., 1969, 40(10), p 3946-3949).

International application WO2009/074755 also describes a process for bonding an at least partially conductive lamellar material, in particular graphene, to a glass-type substrate by making use of the ionic conduction properties of the glass. One electrode is placed on the glass substrate and a second electrode is placed on the lamellar material. The process is carried out in air, at atmospheric pressure and at high temperatures ranging from 150° C. to 350° C. The application of an electric field ranging from 1.2 kV to 2 kV between the two electrodes causes the lamellar material to bond to the glass substrate. The area of the bonded lamellar material is of the order of 5000 µm$^2$ in the case of graphene. In this process, only those lamellae that make direct contact with the substrate, i.e. having a thickness of a few atoms, are bonded. The lamellae that do not make direct contact with the substrate may be removed, for example by peeling. However, this process does not allow the bonded material to be doped, let alone doped in a controlled and reversible manner.

Patent application US 2009/032873 also describes a process for bonding an ultra-thin layer of a monocrystalline semiconductor material to a glassy matrix implementing a step of electrolysis combined with exfoliation that is linked to the prior implantation of ions. This method is based on the presence of an alkali metal ion depletion region to form a bond between said semiconductor material and the glassy matrix. However, this bonding process does not allow the degree of intrinsic doping of the semiconductor material to be modified.

OBJECTS AND SUMMARY

There is therefore a need for a process that is simple to implement and allows a conductive or non-conductive material to be doped in a permanent, controlled and reversible manner.

The first subject of the invention is therefore a process for controllably and reversibly electrostatically doping a conductive or non-conductive material that is deposited in the form of a layer on a solid substrate, said process being characterized in that it is carried out under vacuum, that said substrate is a glassy matrix, and in that it comprises at least the following steps:
  heating said glassy matrix including said layer of conductive or non-conductive material to a doping temperature ($T_D$) ranging from 50° C. to 130° C.;
  applying an electric field between said glassy matrix and said conductive or non-conductive material having a voltage ranging from −300 V to +300 V, while maintaining the temperature at the doping temperature;
  cooling said glassy matrix including said layer of conductive or non-conductive material to an operating temperature ($T_U$), said operating temperature being lower than 50° C.;
said process being carried out on at least a portion of the surface of said conductive or non-conductive material.

The glassy matrix used as a solid substrate according to the process of the invention may be chosen from inorganic glasses such as soda-lime glasses, borosilicate glasses or any other glass endowed with ionic conductivity.

According to one preferred embodiment, the glassy matrix used is a soda-lime or borosilicate glass matrix.

The material to be doped is a conductive or non-conductive material, the conductivity of which is increased by doping, i.e. under the effect of the electric field applied between the conductive or non-conductive material and an electrode that is placed on the other surface of the substrate that forms the glassy matrix.

The conductive or non-conductive material must be deposited on the glassy matrix and may in particular be chosen from the group comprising graphene, lamellar materials such as molybdenum disulfide ($MoS_2$), tungsten disulfide ($WS_2$), indium selenide (InSe), gallium sulfide (GaS) and gallium selenide (GaSe) or else metal oxides such as zinc oxide (ZnO), indium tin oxide (ITO) or cuprate superconductors.

According to one preferred embodiment, the conductive or non-conductive material is chosen from graphene, molybdenum disulfide ($MoS_2$) and zinc oxide (ZnO).

The layer of the conductive or non-conductive material deposited on the glassy matrix may be of any thickness but the thickness of the doped material at the material-glass interface varies between atomic thickness and a few nanometres.

According to the invention, the expression "a thickness of a few nanometres" means a thickness ranging from about 1 to 100 nanometres, and even more preferably from about 1 to 10 nanometres.

The surface of the glassy matrix is preferably polished and clean to ensure good contact with the layer of conductive or non-conductive material to be deposited.

The electrostatic doping process is carried out under vacuum, preferably at a pressure that is lower than about $10^{-3}$ mbar. Specifically, atmospheric conditions may affect doping quality and, in particular, surrounding gas molecules may lead to depolarization of the doped material.

The electrostatic doping process is based on the mobility of the ions present in the glassy matrix, in particular of the cations such as Na$^+$ and Li$^+$, under the effect of the electric field applied between the glassy matrix and the layer of conductive or non-conductive material, at a given temperature. Specifically, when the temperature of the glassy matrix is higher than or equal to 50° C., the ions that are present in the glassy matrix are mobile and may migrate under the effect of the electric field. In general, the mobility of the ions increases with temperature. Thus, in the doping temperature range ($T_D$), the ions are mobile and migrate under the effect of the electric field. Conversely, at the operating temperature ($T_U$), the ions that are present in the glassy matrix are no longer mobile even in the presence of an electric field. The glassy matrices used in the process according to the invention have an operating temperature that is lower than the doping temperature.

In one preferred embodiment of the process according to the invention, the doping temperature varies from about 65° C. to 130° C., and even more preferably from about 80° C. to 130° C.

The electric field may be applied by connecting both said layer of conductive or non-conductive material and the glassy matrix to a voltage source by means of a first and of a second electrode, respectively, for example according to the diagram presented in FIG. 1. In this figure, the voltage source 1 is connected both to the conductive or non-conductive material 2 via a first electrode 3 and to the glassy matrix 4 via a second electrode 5.

The voltage source is connected both to the face referred to as the "front" face of the glassy matrix/conductive material assembly, which is the face including the layer of material to be doped deposited on the glassy matrix, and to the face referred to as the "back" face of said assembly, which is the face opposite the glassy matrix.

According to a first embodiment, the conductive or non-conductive material is said to be thin and/or lamellar, having a thickness of less than 100 nanometres. In this case, connection to the front face is preferably made via a metal circuit that is deposited partly on the material to be doped and partly on the glassy matrix. A thin material may for example be chosen from lamellar materials such as graphene or $MoS_2$. According to this embodiment, conventional methods for forming a metal circuit may be used, such as for example optical or electron-beam lithography or the technique of evaporation through a mask. In this embodiment, the metal circuit consists of one or more metals that may be chosen according to the material to be doped, such as chromium and gold for graphene or titanium and gold for $MoS_2$.

According to a second embodiment, the conductive or non-conductive material is thick and/or polycrystalline, i.e. it has a thickness of more than 100 nm, and may be formed from multiple crystals. In this case, connection to the front face may be made more simply by placing a metal tip connected to the voltage source directly on the conductive or non-conductive material. The connection may, for example, be made by means of a near-field microscope tip in the case of local doping as mentioned below. According to this embodiment, the thick and polycrystalline material to be doped may be chosen from metal oxides such as ZnO or $TiO_2$.

The voltage source is also connected to the back face of the glassy matrix using, for example, a metal electrode. Contact between the back face of the glassy matrix and the electrode may be made by placing the glassy matrix directly on the electrode or by holding the glassy matrix against the electrode by means of a spacer. Contact may also be made by using a conductive adhesive, for example silver lacquer, or by evaporating a metal.

According to one embodiment, the connection between the voltage source and the glassy matrix/material assembly is made at the operating temperature and the glassy matrix/material to be doped/electrical circuit assembly is subsequently heated to the doping temperature.

According to another embodiment, the glassy matrix/material assembly is heated to the doping temperature then the electrical circuit is put in place.

By convention, the conductive or non-conductive material is considered to have a potential of zero. An electrical doping potential ($V_D$) is applied between the electrode making contact with the conductive or non-conductive material (first electrode) and the electrode making contact with the back face of the glassy matrix (second electrode).

According to a first particular embodiment, the electrical potential that is applied to the second electrode is positive with respect to the potential of the first electrode. In this case, the second electrode is then the electrode having the highest potential and the cations of the glassy matrix migrate in the direction of the first electrode, gathering in this way close to the interface between the glassy matrix and the conductive or non-conductive material. The proximity of positive charges to the interface causes the electrons of the conductive or non-conductive material to migrate towards the interface. In this embodiment, the doping process of the invention in an n-type doping process.

According to a second particular embodiment, the electrical potential that is applied to the second electrode is negative with respect to the potential of the first electrode. In this case, the first electrode is the electrode having the highest potential and the cations of the glassy matrix migrate towards the back face of the glassy matrix, in the opposite direction to the conductive or non-conductive material. A cation depletion region, referred to as a space charge region, is therefore formed in the glassy matrix in proximity to the interface with the conductive or non-conductive material, causing the electrons of the conductive or non-conductive material to migrate in the opposite direction to the interface.

According to this embodiment, a hole region is therefore formed in the material in proximity to the interface. According to this embodiment, the doping process of the invention is a p-type doping process. The speed of migration of the ions depends on the absolute value of the applied voltage. The duration for which the voltage is applied determines the amount of charge that migrates and thus the resulting doping level.

According to another embodiment, the glassy matrix contains positive and negative ions that migrate in opposite directions under the effect of the electric field. According to this embodiment, the space charge region is formed at the glassy matrix/conductive or non-conductive material interface either through the accumulation of negative charge or through the accumulation of positive charge.

In general, a positive voltage $V_D$ forms a positive space charge region that dopes the material with electrons (n-type doping). A negative voltage $V_D$ forms a negative space charge region that dopes the material with holes (p-type doping).

According to the process of the invention, the voltage may be applied at a constant value or, conversely, gradually. The way in which the voltage is applied depends on the desired doping level and the variation, during the doping operation, in the dielectric properties of the material to be doped.

The voltage of the electric field applied for the doping operation according to the process of the invention preferably varies from about −100 V to +100 V.

Once the material to be doped has reached the desired doping level, the bias is fixed by rapidly cooling the glassy matrix/conductive or non-conductive material assembly to the temperature $T_U$, either by simply discontinuing the heating operation or by discontinuing the heating operation in combination with an operation of cooling by cryogenic fluid. At this operating temperature, the mobility of the ions is considered to be zero and the ions are therefore fixed. The space charge region doping the material is therefore also fixed. At the operating temperature, the doping voltage and the metal electrodes may be removed without the ions migrating. The electrostatic doping is therefore permanent as long as the doped layer is not subjected to any depolarizing processes, for example through contact with polarizable molecules.

The duration for which the electric field is applied varies according to the desired doping intensity, which itself depends on the type of glass used (ion content), on the temperature and on the absolute value of the field. Typically, the duration for which the electric field is applied may vary from 1 minute to a few hours, and for example 2 hours to reach the maximum doping level in graphene (FIG. 4).

Advantageously, the doping can be modified. Specifically, it is sufficient to expose the glassy matrix/doped material assembly to the doping temperature again to render the ions mobile and to apply a voltage to strengthen the doping, for example, or to reverse it or cancel it out.

The layer of conductive or non-conductive material may be deposited on the glassy matrix by means of methods known from the prior art such as chemical vapour deposition, physical vapour deposition, by depositing freshly cleaved crystals or by means of anodic bonding. In the case of the material to be doped being graphene or $MoS_2$, the deposition operation may, for example, be carried out by means of the adhesive tape exfoliation method, by means of CVD (chemical vapour deposition), by means of wedging or dry transfer or by means of anodic bonding. When the material to be doped is an oxide such as zinc oxide (ZnO), the deposition operation may, for example, be carried out by means of a sol-gel process, by means of thermal evaporation, by means of CVD, pulsed laser deposition (PLD) or sputtering.

According to one preferred embodiment, the glassy matrix is borosilicate glass and the conductive or non-conductive material is graphene.

According to another preferred embodiment, the glassy matrix is borosilicate glass and the conductive or non-conductive material is molybdenum disulfide.

According to another preferred embodiment, the glassy matrix is soda-lime glass and the conductive or non-conductive material is zinc oxide.

The doping value may be measured during the doping process or, at the operating temperature, once doping has been carried out. During the doping operation, the measurement may be made directly according to the delivered voltage, which is proportional to the amount of charge that is displaced in the glassy matrix and, hence, to the resulting doping value in the material. The doping value may also be evaluated by means of infrared or Raman optical spectroscopy methods, which allow doping to be quantified according to the variation in certain spectral lines. In the case of multiple electrical contacts being positioned on the conductive or non-conductive material, in Hall bar or van der Pauw geometries for example, doping may be measured by Hall effect by applying a magnetic field.

According to one embodiment, it is possible to carry out localized doping by applying one or more voltage points to the surface of the material. Specifically, if the material is non-conductive, a fine tip in contact with a localized region of the material will induce a change in doping only in the vicinity of the tip.

According to another embodiment and as an extension of the local doping operation envisaged above, it is possible to create a doping gradient by applying different voltage points at various sites on the surface of the non-conductive material. A gradient may, for example, be produced for the purpose of forming a junction between an electron-doped region and a hole-doped region.

Once the doping operation has been carried out, various parameters may be measured, in particular, the charge carrier density in the layer of conductive or non-conductive material, the difference between the sheet resistance of the material before and after doping (ΔRs), or the transparency of the doped material in terms of percentage with respect to the transparency of the material before doping.

The charge carrier density and the doping type (n or p) may be measured by means of the techniques mentioned above and in particular by means of Hall effect measurements. The resulting charge carrier density may reach up to about $10^{15}$ cm$^{-2}$.

The difference in sheet resistance of the material (ΔRs) and the transparency of the doped material before and after doping may be measured by means of suitable techniques that are well known to those skilled in the art. These values clearly depend on the material and on the doping level. For single-layer CVD graphene, the process according to the invention allows sheet resistances of less than 200 ohms/sq to be reached, with a level of transparency that is undiminished with respect to the undoped material, i.e. 97% for a doping level of $5 \cdot 10^{13}$ cm$^{-2}$.

Inspection by Raman optical spectroscopy also makes it possible to check that the doping operation has not introduced any defects into the conductive or non-conductive material.

A second subject of the invention is the doped conductive or non-conductive material obtained according to the process such as defined in the first subject of the invention, said material being characterized in that it takes the form of a layer of a doped conductive or non-conductive material that is borne by a glassy matrix and in that a space charge region is present on at least a portion of the glassy matrix/doped conductive or non-conductive material interface.

The characteristics of the doped conductive or non-conductive material obtained according to the process of the invention and, in particular, those of the glassy matrix used, of the conductive or non-conductive material used, the thickness and the area of the conductive or non-conductive material, the preferred glassy matrix and conductive or non-conductive material associations, as well as the parameters of charge carrier density, difference in sheet resistance of the material before and after doping (ΔRs), transparency and defects in the material, are such as defined in the first subject of the invention.

According to one preferred embodiment of the invention, the charge carrier density in the space charge region at the glassy matrix/doped conductive or non-conductive material interface varies from $-10^{15}$ cm$^{-2}$ to $+10^{15}$ cm$^{-2}$.

According to the invention, said conductive or non-conductive material obtained upon completion of the doping process forming the first subject of the invention is therefore a material that is doped exclusively by the electrostatic action of the space charge region resulting from an accumulation of the cations that are present in the glassy matrix (positive charge region) or from a depletion of said cations (negative charge region) at the site of at least a portion of the glassy matrix/conductive or non-conductive material interface.

According to one embodiment, the space charge region that is present on at least a portion of the glassy matrix/doped conductive or non-conductive material interface is positive (cation accumulation region), and the doping operation is an n-type doping operation. In this case, the charge carrier density preferably varies from about $-10^{10}$ cm$^{-2}$ to about $-10^{15}$ cm$^{-2}$, and even more preferably from $-10^{12}$ cm$^{-2}$ to $-10^{14}$ cm$^{-2}$.

According to another embodiment, the space charge region that is present on at least a portion of the glassy matrix/doped conductive or non-conductive material interface is negative (cation depletion region), and the doping operation is referred to as a p-type doping operation. In this case, the charge carrier density preferably varies from $+10^{10}$ cm$^{-2}$ to $+10^{15}$ cm$^{-2}$, and even more preferably from $+10^{12}$ cm$^{-2}$ to $+10^{14}$ cm$^{-2}$.

A third subject of the invention is the use of the doped conductive or non-conductive material obtained according to the process of the invention and such as defined according to the second subject of the invention, in systems requiring a transparent electrode, semiconductor-based devices or devices containing a doping-induced superconductor.

According to one preferred embodiment, the conductive or non-conductive material is graphene, the glassy matrix is borosilicate or soda-lime glass and the doped conductive or non-conductive material that is obtained according to the process of the invention may be used for the manufacture of touchscreens or photovoltaic cells.

According to another preferred embodiment, the conductive or non-conductive material is ZnO, the glassy matrix is soda-lime glass and the doped conductive or non-conductive material that is obtained according to the process of the invention may be used for the manufacture of electrochromic glass.

BRIEF DESCRIPTION OF THE DRAWINGS

The following figures and examples illustrate the invention in greater detail without however limiting the scope thereof.

DETAILED DESCRIPTION

Examples

Example 1: Doping a Layer of Graphene on Borosilicate Glass According to the Process in Accordance with the Invention The doping process has been carried out using commercially available single-layer CVD (chemical vapour deposition) graphene on copper foil (Graphene Supermarket, graphene-supermarket.com) deposited on borosilicate glass to a thickness of 0.5 mm. The deposition operation has been carried out by means of the poly(methyl methacrylate) transfer method (as per the method explained by X. Li et al. Nano Lett., 2009, 9, 4359). The assembly has been linked to a voltage source by electrodes, one making contact with the graphene (chromium/gold; respective thicknesses 2 nm/70 nm, thermally evaporated through a mask) and the other making contact with the glassy matrix (silver lacquer). The assembly has then been placed under vacuum at a pressure of less than $10^{-6}$ mbar and has been heated to a temperature of 142° C. A voltage of 285 V has been applied for 100 min. The van der Pauw method (van der Pauw, L. J. (1958) *Philips Research Reports* 13: 1-9) has been used to measure the resistivity of the material, the doping type (n or p) and the charge carrier density.

Figure 1:
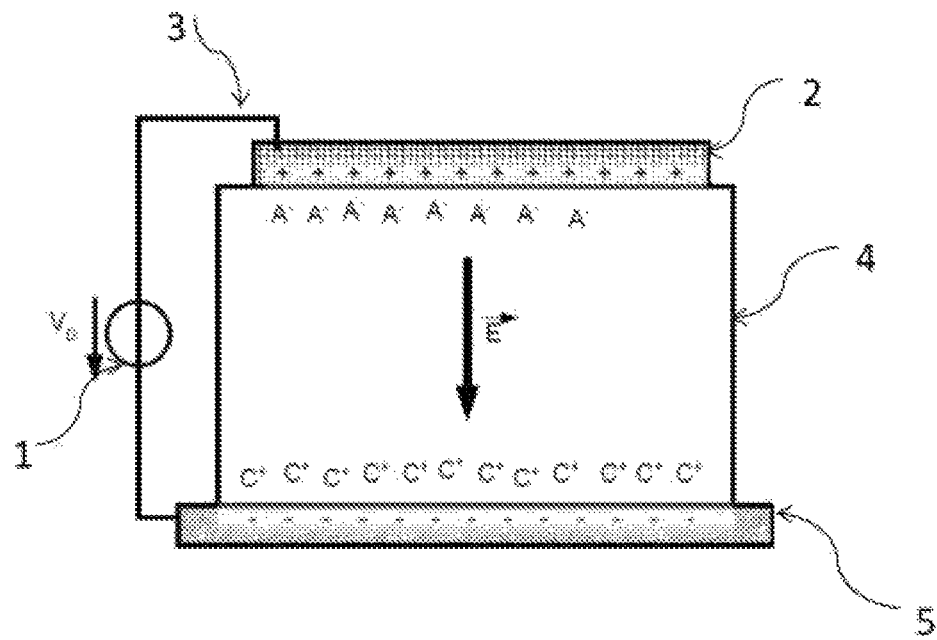
FIG. 1 shows the device for doping a conductive or non-conductive material (2) that is deposited on one face of an inorganic glass substrate (4), a voltage source (1) connected to the conductive or non-conductive material by an electrode (3) and to the other face of the glassy matrix by another electrode (5).
Figure 2:
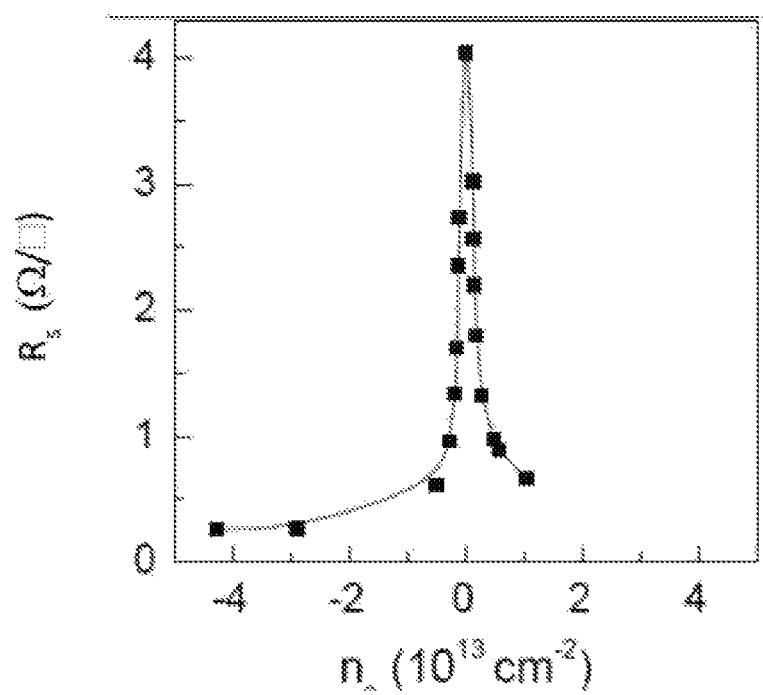
FIG. 2 shows the doping of a layer of graphene with time in terms of the variation in its sheet resistance.

Change in sheet resistance of the material, $\Delta Rs=-609$ Ω/sq (FIG. 2)

Charge carrier density: $N=4.4 \times 10^{13}$ cm$^{-2}$

Transparency=97% at 550 nm

Example 2: Doping a Layer of Molybdenum Disulfide on Borosilicate Glass According to the Process in Accordance with the Invention The doping operation has been carried out according to the process of Example 1, on a 2 nm-thick MoS$_2$ sample deposited by anodic bonding using a sample comprising a layer of molybdenum disulfide, having an area of 50 μm$^2$, deposited on a 0.5 mm-thick borosilicate glass matrix. The sample has been placed under vacuum at a pressure of $10^{-6}$ mbar then heated to a temperature of 130° C. A voltage of +4 V has been applied for 30 minutes.

Figure 3:
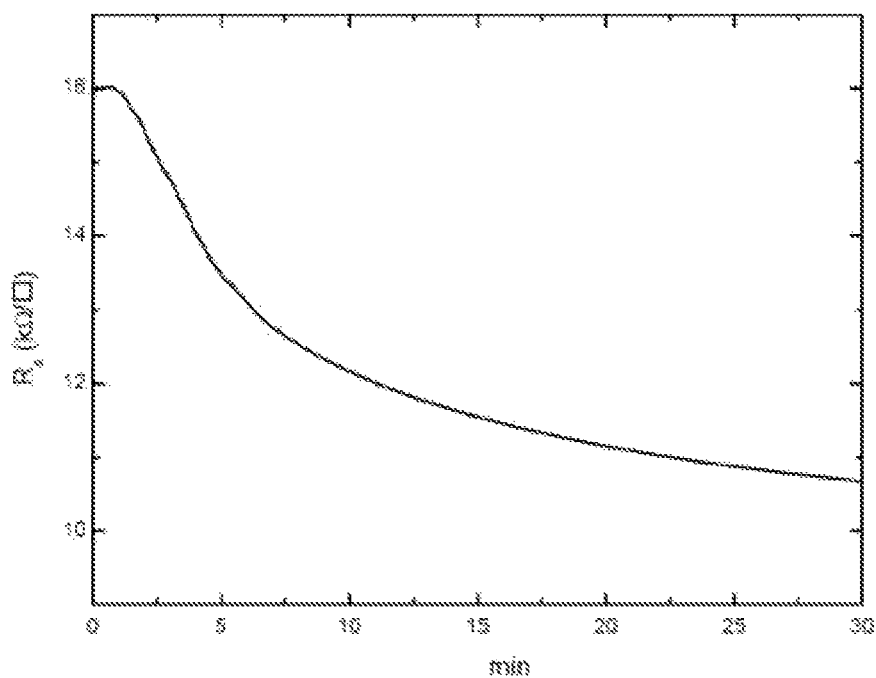
FIG. 3 shows the doping of a layer of molybdenum disulfide with time in terms of the variation in its sheet resistance.

Change in sheet resistance of the material, $\Delta Rs=-5$ kΩ/sq (FIG. 3)

Charge carrier density: $N=10^{13}$ cm$^{-2}$

Example 3: Doping a Layer of Zinc Oxide on Glass According to the Process in Accordance with the Invention The doping operation has been carried out using a sample comprising a 25 nm-thick layer of zinc oxide, having an area of 1 mm$^2$, deposited by RF (radiofrequency) sputtering on a 0.5 mm-thick soda-lime glass matrix. The sample has been placed under vacuum at a pressure of $10^{-6}$ mbar then heated to a temperature of 130° C. A voltage of +35 V has been applied for 70 minutes.

Figure 4:
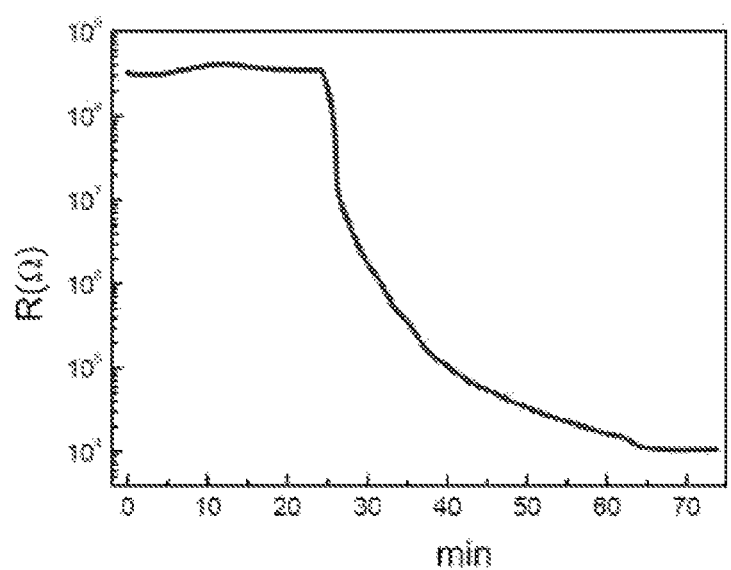
FIG. 4 shows the doping of a layer of zinc oxide with time in terms of the variation in its sheet resistance.

Change in sheet resistance of the material, $\Delta Rs$, decreases by four orders of magnitude, from $10^8$ to $10^4$ kΩ/sq (FIG. 4)

Charge carrier density: $N=10^{14}$ cm$^{-2}$

Transparency=92% at 550 nm

Example 4: Comparative Example Between a Process Carried Out in Air and a Doping Operation Carried Out Under Vacuum In this example, the process has been carried out using two identical samples 1 and 2 comprising a 0.4 nm-thick layer of graphene on a 0.5 mm-thick borosilicate glass matrix. The sample 1 has been placed under vacuum at a pressure of $10^{-6}$ mbar then heated to a temperature of 71° C. A voltage of −190 V has been applied for 120 minutes. The sample 2 has been left in air then heated to a temperature of 145° C. A voltage of −200 V has been applied for 120 minutes.

Figure 5:
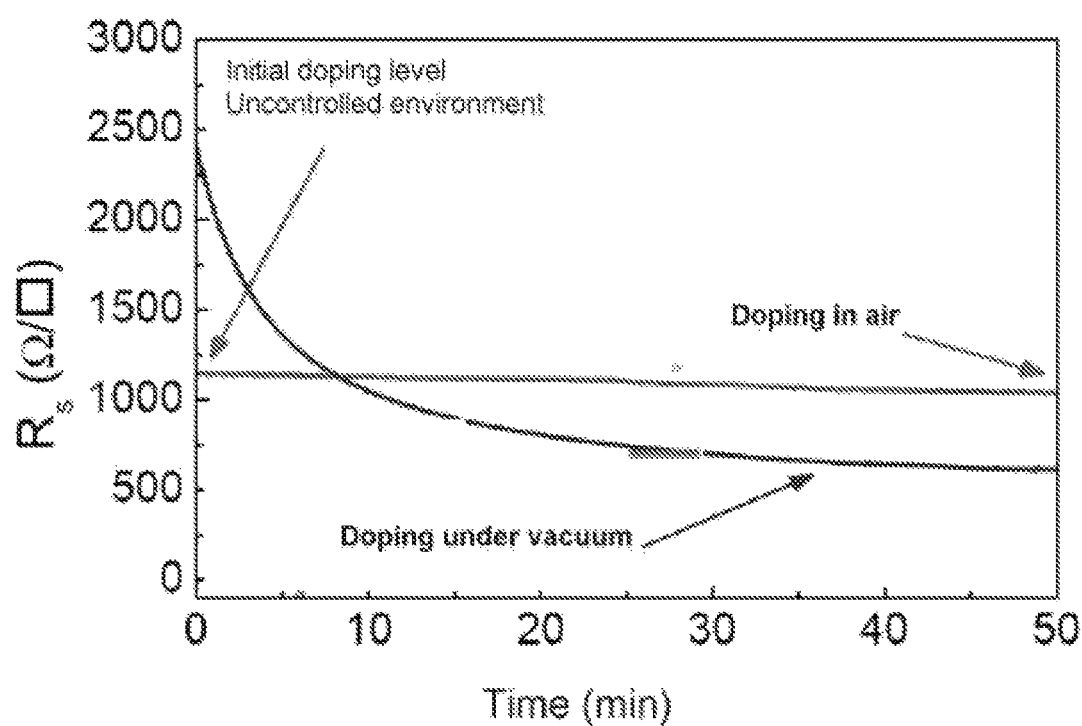
FIG. 5 shows an example of a doping operation carried out under vacuum compared with a doping operation carried out in air, in terms of the variation in its sheet resistance.

Change in sheet resistance of sample 1, $\Delta Rs=0.65$ kΩ/sq (substantially horizontal curve, FIG. 5)

Change in sheet resistance of sample 2, $\Delta Rs=-0.06$ kΩ/sq (curved curve, FIG. 5)

The doping results obtained for each of the comparative samples 1 and 2 are given in the appended FIG. 5. These results show that when the process is carried out in air at atmospheric pressure (Sample 1: substantially horizontal curve) instead of under vacuum (Sample 2: curved curve), no doping is obtained.

The invention claimed is:

1. Process for controllably and reversibly electrostatically doping a conductive or non-conductive material that is deposited in the form of a layer on a solid substrate, wherein:
    said conductive or non-conductive material is chosen from graphene, molybdenum disulfide and zinc oxide, and
    said process is carried out under vacuum, that said substrate is a glassy matrix, said process comprises at least the following steps:
        heating said glassy matrix including said layer of conductive or non-conductive material to a doping temperature ($T_D$) ranging from 50° C. to 130° C.;
        applying an electric field between said glassy matrix and said conductive or non-conductive material having a voltage ranging from −300 V to +300 V, while maintaining the temperature at the doping temperature;
        cooling said glassy matrix including said layer of conductive or non-conductive material to an operating temperature ($T_U$), said operating temperature being lower than 50° C.;

said process being carried out on at least a portion of the surface of said conductive or non-conductive material.

2. Process according to claim 1, the thickness of the doped material at the material-glass interface varies between atomic thickness and a few nanometres.

3. Process according to claim 1, wherein said process is carried out at a pressure that is lower than $10^{-3}$ mbar.

4. Process according to claim 1, wherein the doping temperature varies from 65° C. to 130° C.

5. Process according to claim 1, wherein the electric field is applied by connecting both said layer of conductive or non-conductive material and the glassy matrix to a voltage source by means of a first and of a second electrode, respectively.

6. Process according to claim 5, wherein the doping operation is an n-type doping operation and that the electrical potential applied to the second electrode is positive with respect to the potential of the first electrode.

7. Process according to claim 5, wherein the doping operation is a p-type doping operation and that the electrical potential applied to the second electrode is negative with respect to the potential of the first electrode.

* * * * *